(12) United States Patent
Hwang et al.

(10) Patent No.: US 8,569,887 B2
(45) Date of Patent: Oct. 29, 2013

(54) POST PASSIVATION INTERCONNECT WITH OXIDATION PREVENTION LAYER

(75) Inventors: Chien Ling Hwang, Hsinchu (TW); Yi-Wen Wu, Xizhi (TW); Chung-Shi Liu, Shinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 176 days.

(21) Appl. No.: 12/907,249

(22) Filed: Oct. 19, 2010

(65) Prior Publication Data

US 2011/0101521 A1    May 5, 2011

Related U.S. Application Data

(60) Provisional application No. 61/258,414, filed on Nov. 5, 2009.

(51) Int. Cl.
*H01L 23/48* (2006.01)
*H01L 23/52* (2006.01)
*H01L 29/40* (2006.01)

(52) U.S. Cl.
USPC .... 257/751; 257/750; 257/758; 257/E23.141; 257/E23.154; 257/E23.155

(58) Field of Classification Search
USPC ........... 257/737, E23.141, E23.154, E23.155, 257/750, 758, 751
See application file for complete search history.

(56) References Cited

U.S. PATENT DOCUMENTS

| | | | |
|---|---|---|---|
| 5,466,635 A | 11/1995 | Lynch et al. | |
| 6,218,281 B1 | 4/2001 | Watanabe et al. | |
| 6,229,220 B1 | 5/2001 | Saitoh et al. | |
| 6,500,750 B1 * | 12/2002 | Shroff et al. | 438/622 |
| 6,578,754 B1 | 6/2003 | Tung | |
| 6,592,019 B2 | 7/2003 | Tung | |
| 6,605,528 B1 * | 8/2003 | Lin et al. | 438/618 |
| 6,818,545 B2 | 11/2004 | Lee et al. | |
| 6,853,076 B2 | 2/2005 | Datta et al. | |
| 6,917,119 B2 | 7/2005 | Lee et al. | |
| 7,064,436 B2 | 6/2006 | Ishiguri et al. | |
| 7,391,112 B2 | 6/2008 | Li et al. | |
| 2002/0185733 A1 * | 12/2002 | Chow et al. | 257/737 |
| 2006/0292851 A1 * | 12/2006 | Lin et al. | 438/618 |
| 2007/0232051 A1 * | 10/2007 | Wang et al. | 438/612 |

(Continued)

FOREIGN PATENT DOCUMENTS

| | | |
|---|---|---|
| JP | 5-335313 | 12/1993 |
| JP | 2000-228420 | 8/2000 |
| TW | 200929435 | 7/2009 |

OTHER PUBLICATIONS

U.S. Appl. No. 12/786,698, filed May 25, 2010 entitled "Self-Aligned Protection Layer For Copper Post Structure", Chung-Shi Liu et al. (Not Yet Published).

(Continued)

*Primary Examiner* — Michael Lebentritt
*Assistant Examiner* — Aaron Dehne
(74) *Attorney, Agent, or Firm* — Lowe Hauptman & Ham, LLP

(57) ABSTRACT

A copper interconnect line formed on a passivation layer is protected by a copper-containing material layer including a group III element, a group IV element, a group V element or combinations thereof.

20 Claims, 8 Drawing Sheets

(56) References Cited

U.S. PATENT DOCUMENTS

| | | |
|---|---|---|
| 2008/0138624 A1* | 6/2008 | Lewis et al. .................. 428/412 |
| 2010/0041234 A1* | 2/2010 | Weigel et al. ................. 438/694 |
| 2010/0090318 A1 | 4/2010 | Hsu et al. |

OTHER PUBLICATIONS

Liu, C.S. et al., Self Aligned CuGeN Process for 32/22nm Nodes and Beyond, IEEE 987-1-4244-1911-1/08, pp. 199-201.

* cited by examiner

POST PASSIVATION INTERCONNECT WITH OXIDATION PREVENTION LAYER

CROSS-REFERENCE TO RELATED APPLICATIONS

The present application claims priority of U.S. Provisional Patent Application Ser. No. 61/258,414, filed on Nov. 5, 2009 which is incorporated herein by reference in its entirety.

TECHNICAL FIELD

This disclosure relates to the fabrication of integrated circuit devices, and more particularly, to integrated circuit devices having post passivation interconnects.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. A passivation layer is also included for protecting underlying layers from moisture, contamination, or other conditions that can potentially degrade or damage the integrated circuit. Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls. In a post passivation interconnect ("PPI") process, contact pads and other conductors are fabricated on top of the passivation layer and connected to the contact regions of the integrated circuit. The PPI scheme can be used to re-route the connections to integrated circuit to facilitate contact to the package. Conventionally, silicon nitride or polyimide is provided for preventing the PPI made of Cu from oxidation, but an additional patterning step (e.g., an etching process for pattering silicon nitride layer or an exposure step for patterning the polyimide layer) is necessary to allow subsequent bump processes. The Q-time between the Cu plating to the polyimide coating process is a concern since there is no deoxidizing step in the polyimide process.

BRIEF DESCRIPTION OF THE DRAWINGS

The objects, features and advantages of this disclosure will become apparent by referring to the following detailed description of exemplary embodiments with reference to the accompanying drawings, wherein.

DETAILED DESCRIPTION

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
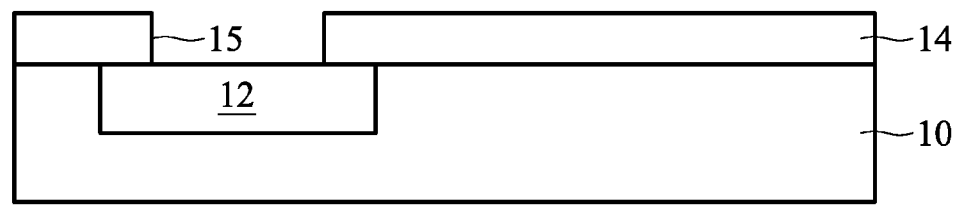
FIGS. 1A to 1C are cross-sectional diagrams depicting an exemplary embodiment of a PPI process.
Figure 1B:
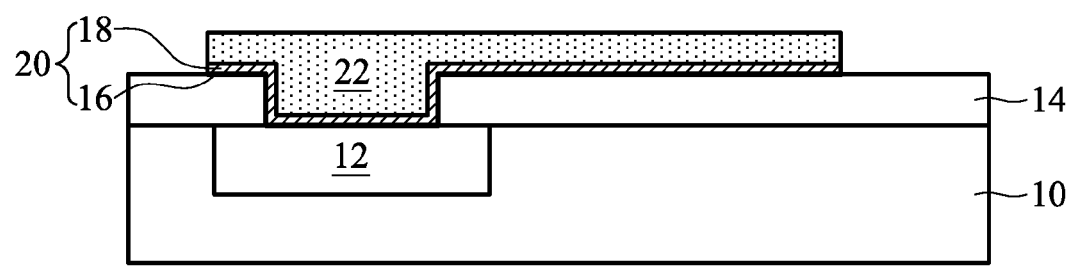
Figure 1C:
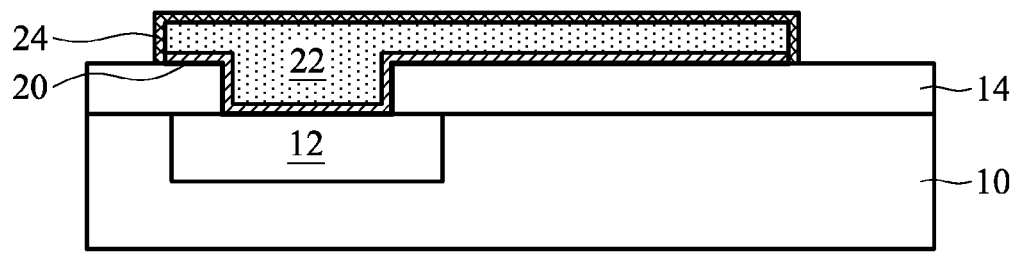

Herein, cross-sectional diagrams of FIG. 1A to FIG. 1C illustrate an exemplary embodiment of a PPI process.

In FIG. 1A, an example of a substrate 10 used for post passivation interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A contact region 12 is a top metallization layer formed in a top-level inter-layer dielectric layer, which is a portion of conductive routs and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials. In one embodiment, the contact region 12 is a bond pad region, which may be used in the bonding process to connect the integrated circuits in the respective chip to external features.

FIG. 1A also illustrates a passivation layer 14 formed on the substrate 10 and patterned to form an opening 15 exposing a portion of the contact region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

Referring to FIG. 1B, an adhesion layer 16 and a seed layer 18 are formed on the passivation layer 14 to line the sidewalls and bottom of the opening 15. The adhesion layer 16, also referred to as a glue layer, is blanket formed, covering the passivation layer 14 and the sidewalls and the bottom of opening 15. The adhesion layer 16 may include commonly used barrier materials such as titanium, titanium nitride, tantalum, tantalum nitride, and combinations thereof, and can be formed using physical vapor deposition, sputtering, and the like. The adhesion layer 16 helps to improve the adhesion of the subsequently formed copper lines onto passivation layer 14. The seed layer 18 is blanket formed on the adhesion layer 16. The materials of the seed layer 18 include copper or copper alloys, and metals such as silver, gold, aluminum, and combinations thereof may also be included. The seed layer 18 may also include aluminum or aluminum alloys. In an embodiment, the seed layer 18 is formed by sputtering. In other embodiments, other commonly used methods such as physical vapor deposition or electroless plating may be used. For clarity, the seed layer 18 and the adhesion layer 16 are shown as layers 20 in subsequent drawings.

Also, a post passivation interconnect (PPI) line 22 is formed on the layers 20 to fill the opening 15. Using a mask and a photolithography process, a conductive material fills the opening of the mask followed by removing the mask and the exposed layers 20. The conductive material formed on the layers 20 and filling the opening 15 serves as the PPI line 22. The PPI line 22 may include, but not limited to, for example copper, aluminum, copper alloy, or other mobile conductive materials. The PPI line 22 may further include a nickel-containing layer (not shown) on the top a copper-containing layer. The PPI formation methods include plating, electroless plating, sputtering, chemical vapor deposition methods, and the like. The PPI line 22 connects the contact region 12 to bump features. The PPI line 22 may also function as power lines, re-distribution lines (RDL), inductors, capacitors or any passive components. The PPI line 22 may have a thickness less than about 30 μm, for example between about 2 μm and about 25 μm.

Then the exposed portions of the layers 20 including the adhesion layer 16 and the seed layer 18 are removed. The removal step may include a wet etching process or a dry etching process. In one embodiment, the removal step includes an isotropic wet etching using an ammonia-based acid, which may be a flash etching with a short duration.

Next, as depicted in FIG. 1C, a protection layer 24 is formed on the PPI line 22. The protection layer 24 is a copper-containing material layer including a group III element, a group IV element, a group V element listed in the periodic table or any combination thereof. In one embodiment, the copper-containing material layer may include, but is not limited to, boron (B), germanium (Ge), silicon (Si), carbon (C), nitrogen (N), phosphorous (P) or combinations thereof. In some embodiments, the copper-containing material layer is a CuGeN layer, a CuGe layer, a CuSi layer, a CuSiN layer, a CuSiGeN layer, a CuN layer, a CuP layer, a CuC layer, a CuB layer, or combinations thereof using a selective CVD with gases containing B, Ge, Si, C, N, P or combinations thereof (e.g., $B_2H_6$, $CH_4$, $SiH_4$, $GeH_4$, $NH_3$, $PH_3$). For an example of forming a CuGeN layer, a deoxidize treatment step ($NH_3$ treatment) is performed followed by a $GeH_4$ CVD process.

In one embodiment, the protection layer 24 is employed for preventing the PPI line 22 from oxidation during subsequent processes. Thus the protection layer 24 may also refer to an antioxidation layer or an oxide resistant layer. Also, the protection layer 24 may decrease the PPI stress compared with the conventional use of a silicon nitride layer on the PPI line.

Moreover, the protection layer 24 can remain on the Cu PPI line without an additional etching step on the protection layer 24 for allowing the subsequent bump process. In addition, the formation of the protection layer 24 is selective from the Cu PPI line to the passivation layer and a subsequent polyimide layer, and the resistance (Rs) will not promise much.

Hereinafter, cross-sectional diagrams of FIG. 1D to FIG. 1G illustrate an exemplary embodiment of a bump process on the PPI line.

Figure 1D:
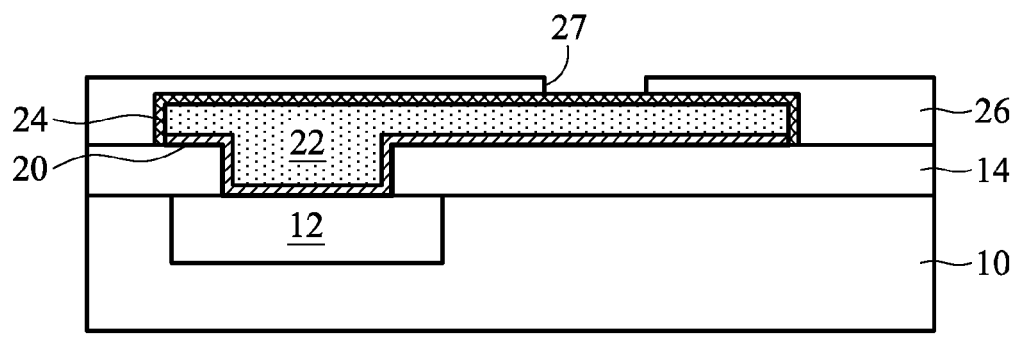
FIGS. 1D to 1H are cross-sectional diagrams depicting an exemplary embodiment of a bump process on a PPI line.

In FIG. 1D, a polymer layer 26 is formed on the passivation layer 14 to cover the protection layer 24 through the steps of coating, curing, descum and the like. Lithography technology and etching processes such as a dry etch and/or a wet etch process are then performed to pattern the polymer layer 26, thus an opening 27 is formed to pass through the polymer layer 26 and expose a portion of the underlying protection layer 24. The polymer layer 26, as the name suggests, is formed of a polymer, such as an epoxy, polyimide, benzocyclobutene (BCB), polybenzoxazole (PBO), and the like, although other relatively soft, often organic, dielectric materials can also be used. In one embodiment, the polymer layer 26 is a polyimide layer. The polymer layer 26 is soft, and hence has the function of reducing inherent stresses on respective substrate. In addition, the polymer layer 26 is easily formed to thickness of tens of microns.

Figure 1E:
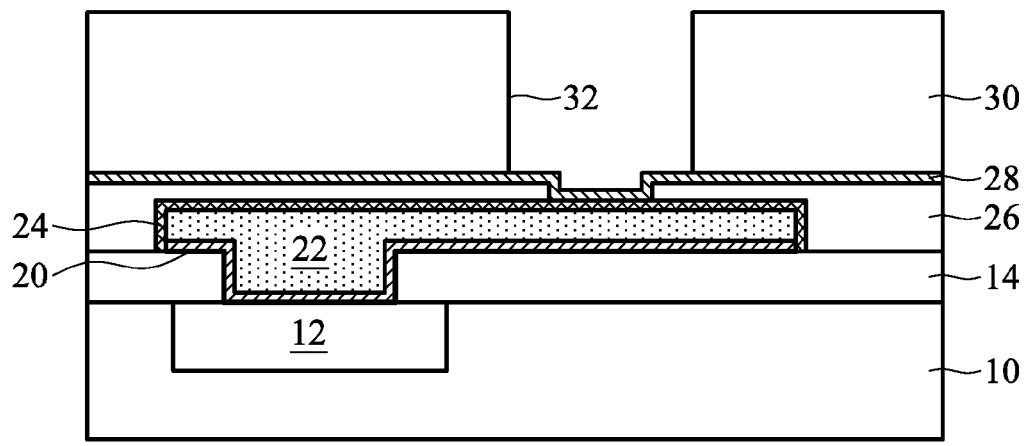

In FIG. 1E, the formation of an under-bump-metallurgy (UBM) layer 28 includes a diffusion barrier layer and a seed layer is performed on the resulted structure. The UBM layer 28 is formed on the polymer layer 26 and the exposed portion of the protection layer 24, and lines the sidewalls and bottom of the opening 27. The diffusion barrier layer, also referred to as a glue layer, is formed to cover the sidewalls and the bottom of the opening 27. The diffusion barrier layer may be formed of tantalum nitride, although it may also be formed of other materials such as titanium nitride, tantalum, titanium, or the like. The formation methods include physical vapor deposition (PVD) or sputtering. The seed layer may be a copper seed layer formed on the diffusion barrier layer. The seed layer may be formed of copper alloys that include silver, chromium, nickel, tin, gold, and combinations thereof. In one embodiment, the UBM layer 28 includes a diffusion barrier layer formed of Ti and a seed layer formed of Cu. Next, a mask layer 30 is provided on the UBM layer 28 and patterned with an opening 32 exposing a portion of the UBM layer 28 for bump formation. In one embodiment, the opening 32 is over the opening 27. In another embodiment, the diameter of the opening 32 is greater or equal to the diameter of the opening 27. The mask layer 30 may be a dry film or a photo-resist film.

Figure 1F:
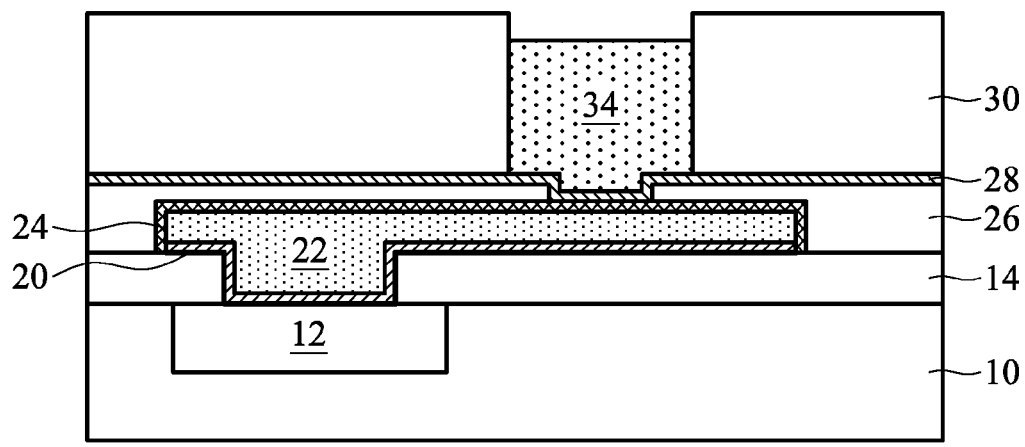

Referring to FIG. 1F, the opening 32 is partially or fully filled with a conductive material with solder wettability. In an embodiment, a copper (Cu) layer 34 is formed on the UBM layer 28 to partially fill the opening 32. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 34. In an exemplary embodiment, the thickness of the Cu layer 34 is greater than 40 μm. In another exemplary embodiment, the thickness of the Cu layer 34 is between about 40~50 μm. In other embodiments, the thickness of the Cu layer 34 is about 40~70 μm, although the thickness may be greater or smaller.

Figure 1G:
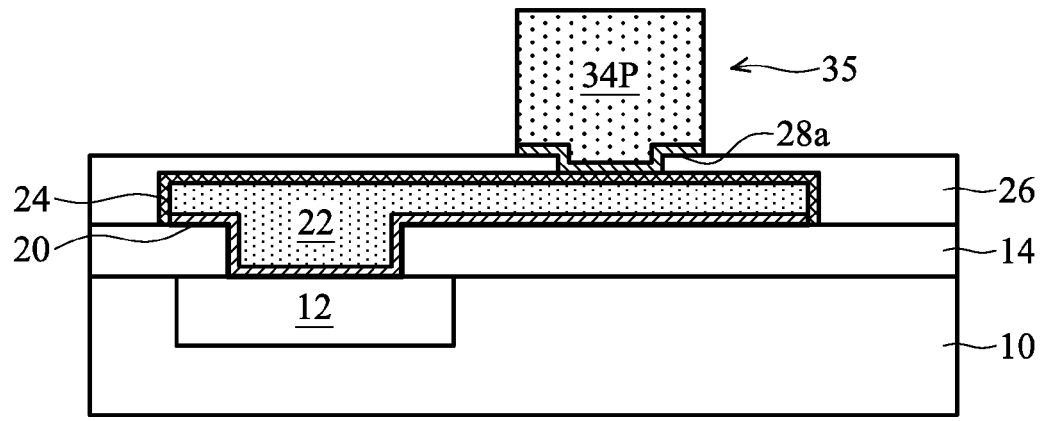

Next, as shown in FIG. 1G, the mask layer 30 is removed. In the case the mask layer 30 is a dry film, it may be removed using an alkaline solution. If the mask layer 30 is formed of photoresist, it may be removed using acetone, n-methyl pyrrolidone (NMP), dimethyl sulfoxide (DMSO), aminoethoxy ethanol, and the like. Then the exposed portion of the UBM layer 28 is etched to expose the underlying polymer layer 26 outside the Cu layer 34. In an exemplary embodiment, the step of removing the UBM layer 28 is a dry etching or a wet etching. For example, an isotropic wet etching (often referred to as flash etching due to its short duration) using an ammonia-based acid is employed. Thus the Cu layer 34 protrudes from the polymer layer 26, also referred to as a Cu post 34P. The Cu post 34P and the underlying UBM layer 28a serve as a bump structure 35. The substrate 10 may then be sawed and packaged onto a package substrate, or another die, with solder balls or Cu posts mounted on a pad on the package substrate or the other die.

Figure 1H:
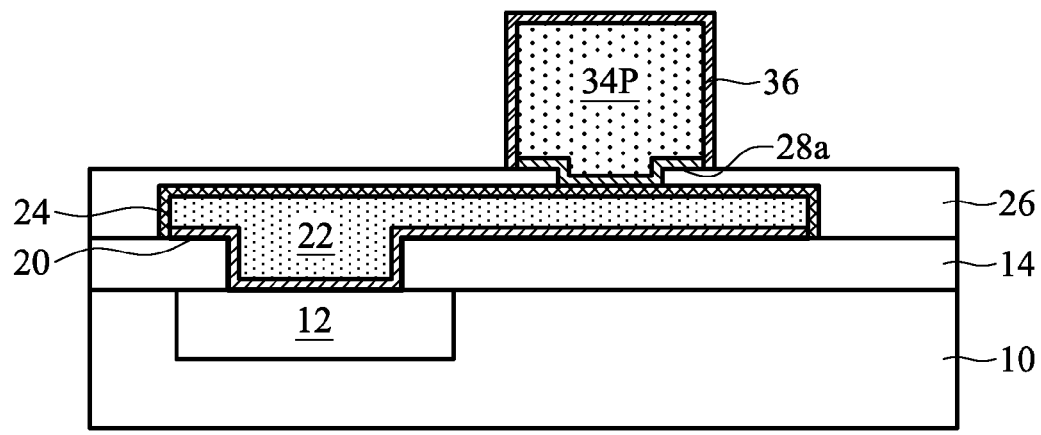

For protecting the surfaces of the Cu post 34P from oxidation, another protection layer 36 may be optionally provided on the Cu post 34P as depicted in FIG. 1H. The protection layer 36 may be selectively formed on the sidewall surface and/or the top surface of the bump structure 35. In an embodiment, the protection layer 36 is a tin-containing layer. For example, the bump structure 35 is immersed in an electroless plating solution containing tin (Sn). Tin is deposited on the bump structure 35 by a chemical reduction process, which once initiated, is autocatalytic. Sn ions in the electroless solution are reduced by chemical agents in the solution, and deposit on the surfaces of the protrusion. Since the plating reaction only occurs on the surface of the bump structure 35, no tin will be plated on the surface of the polymer layer 26. The protection layer 36 provides an environmental seal to prevent the bump structure 35 from oxidation and also improve the adhesion between the bump structure 35 and the underfill in the following package process.

Figure 2A:
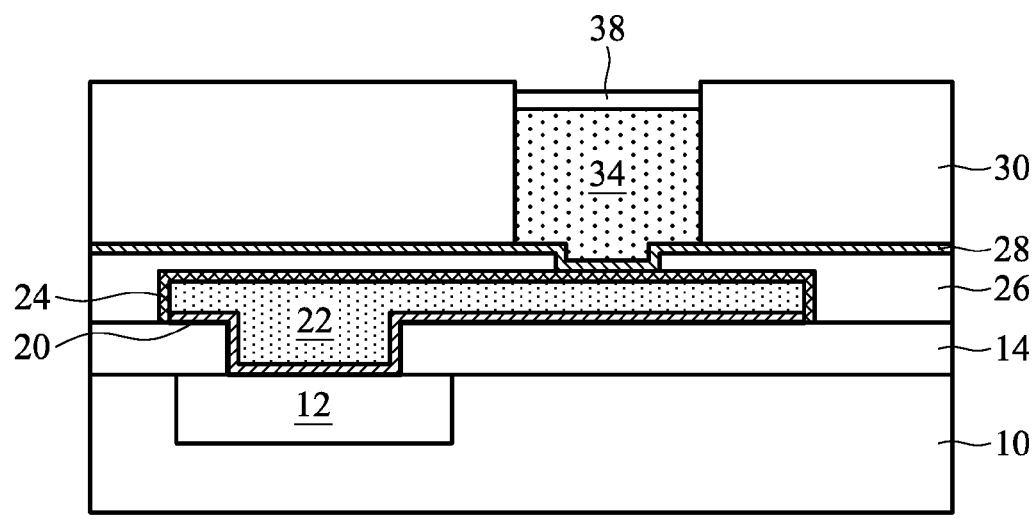
FIGS. 2A to 2C are cross-sectional diagrams depicting an exemplary embodiment of a bump process on a PPI line.
Figure 2B:
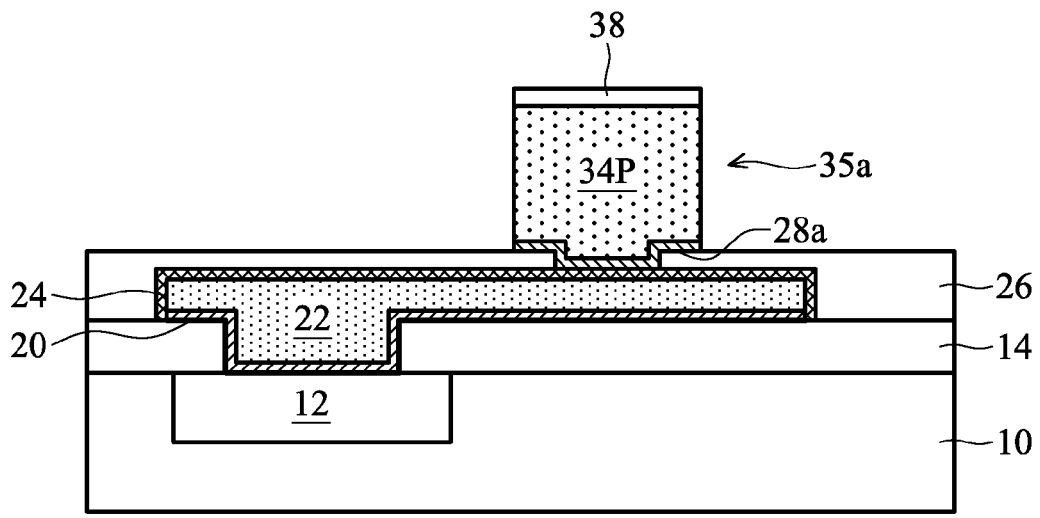
Figure 2C:
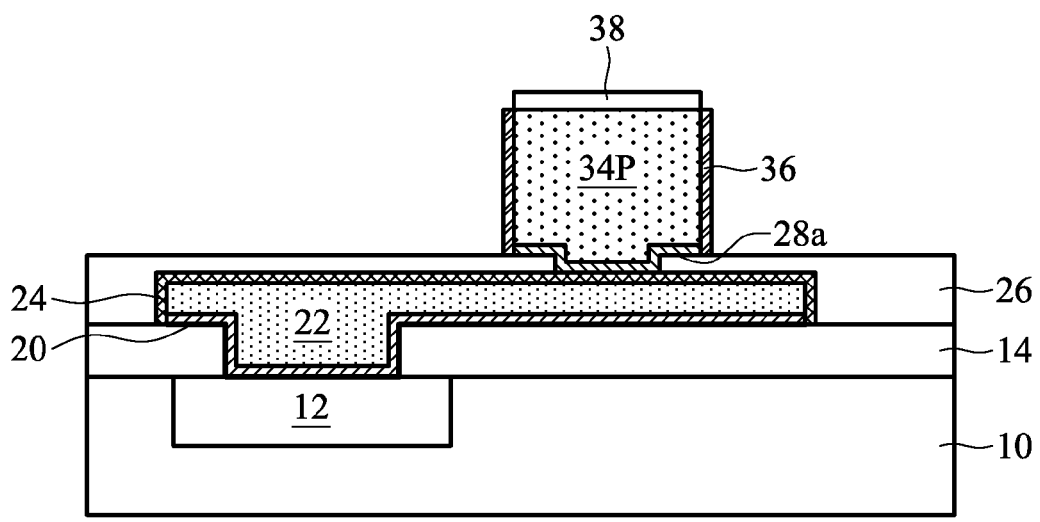

FIG. 2A to FIG. 2C are cross-sectional diagrams depicting an exemplary embodiment of forming a bump structure on a PPI line, while explanation of the same or similar portions to the description in FIG. 1A to FIG. 1H will be omitted.

Referring to FIG. 2A, after forming the Cu layer 34, a cap layer 38 is deposited on the Cu layer 34 within the opening 32 of the mask layer 30. The cap layer 38 may include nickel, tin, tin-lead (SnPb), gold (Au), silver, palladium (Pd), Indium, nickel-palladium-gold (NiPdAu), nickel-gold (NiAu), other similar materials, or alloys. In one embodiment, the cap layer 38 is a lead-free pre-solder layer, for example, SnAg. In another embodiment, the cap layer 38 is a solder material including alloys of tin, lead, silver, copper, nickel, bismuth, or combinations thereof. In the other embodiment, the cap layer 38 is a nickel layer, an Au layer, or a NiAu layer. In FIG. 2B, after removing the mask layer 30 and the UBM layer 28, the Cu layer 34 becomes the Cu post 34P protruding from the polymer layer 26. Thus the UBM layer 28a, the Cu post 34P and the cap layer 38 serve as a bump structure 35a. The cap layer 38 could act as a barrier layer to prevent copper in the Cu post 34P to diffuse into bonding material, such as solder ball, that is used to bond the substrate 10 to external features. The prevention of copper diffusion increases the reliability and bonding strength of the package. In FIG. 2C, another protection layer 38 may be selectively formed on the sidewall surface and/or the top surface of the bump structure 35a. In an embodiment, the protection layer 36 is a tin-containing layer.

Figure 3A:
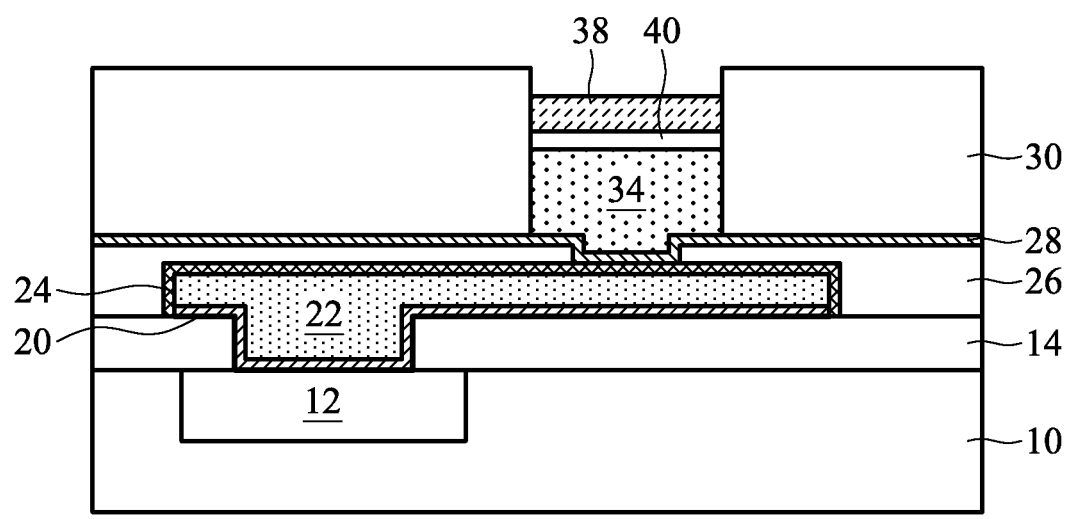
FIGS. 3A to 3C are cross-sectional diagrams depicting an exemplary embodiment of a bump process on a PPI line.
Figure 3B:
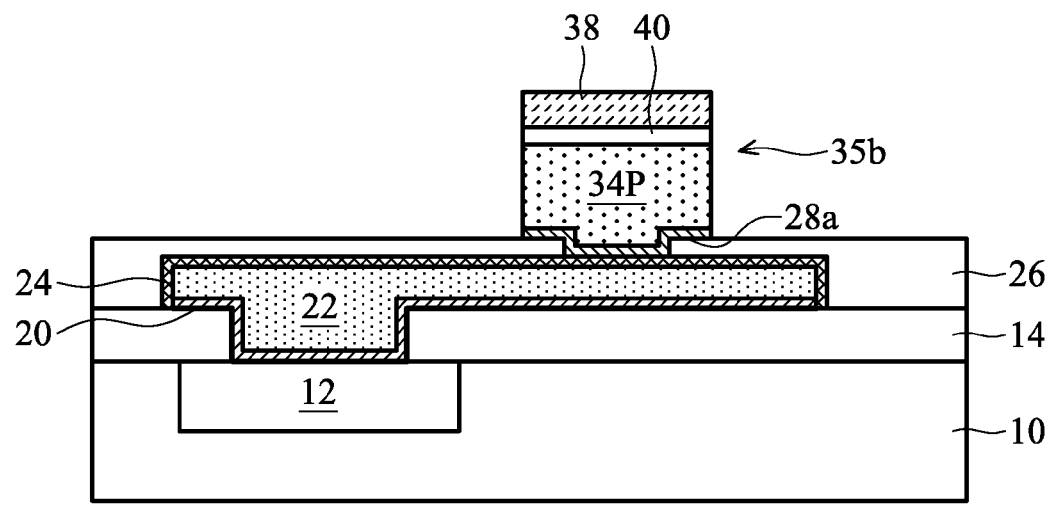
Figure 3C:
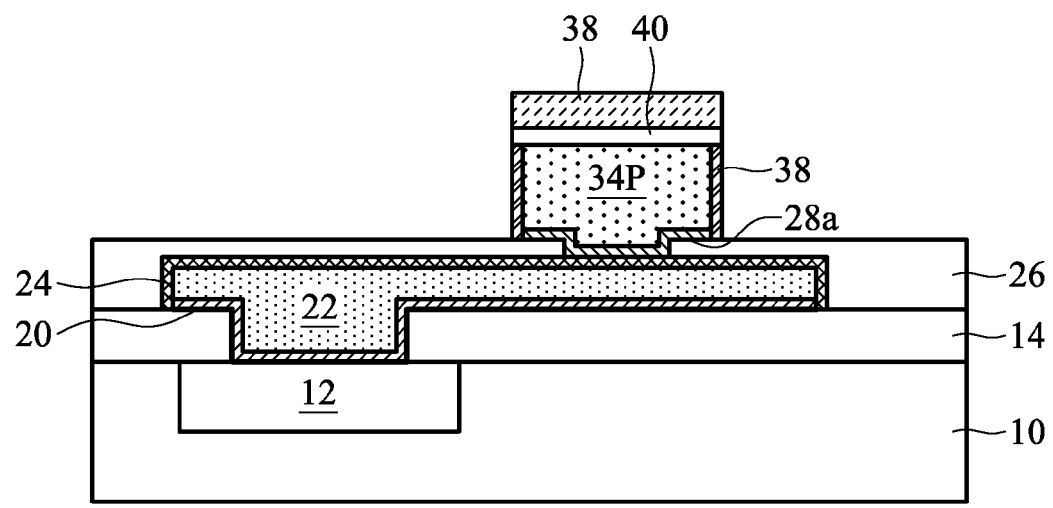

FIG. 3A to FIG. 3C are cross-sectional diagrams depicting an exemplary embodiment of forming a bump structure on a PPI line, while explanation of the same or similar portions to the description in FIG. 1A~1H and FIG. 2A~2C will be omitted.

Referring to FIG. 3A, after forming the Cu layer 34, a cap layer 38 and a solder layer 40 are successively deposited on the Cu layer 34 within the opening 32 of the mask layer 30. The cap layer 38 may include nickel, gold (Au), silver, palladium (Pd), Indium, nickel-palladium-gold (NiPdAu), nickel-gold (NiAu), other similar materials, or alloy. The solder layer 40 may include a lead-free pre-solder layer, SnAg, or a solder material including alloys of tin, lead, silver, copper, nickel, bismuth, or combinations thereof. In FIG. 3B, after removing the mask layer 30 and the UBM layer 28, the Cu layer 34 becomes the Cu post 34P protruding from the polymer layer 26. Thus the UBM layer 28a, the Cu post 34P, the cap layer 38 and the solder layer 40 serve as a bump structure 35b. A solder reflow process may be performed to make the solder layer 40 become a solder ball. In FIG. 3C, another protection layer 38 may be selectively formed on the sidewall surface and/or the top surface of the bump structure 35b. In an embodiment, the protection layer 36 is a tin-containing layer.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. An integrated circuit device, comprising:
   a semiconductor substrate;
   a passivation layer overlying the semiconductor substrate;
   a polymer layer overlying the passivation layer;
   an interconnect line formed between the passivation layer and the polymer layer, the interconnect line extending over a top surface of the passivation layer; and
   a protection layer formed between the interconnect line and the polymer layer;
   wherein the protection layer is a copper-containing material layer comprising at least one of a group III element, a group IV element and a group V element.

2. The integrated circuit device of claim 1, wherein the protection layer is a CuGeN layer.

3. The integrated circuit device of claim 1, wherein the copper-containing material layer comprises at least one of germanium (Ge), silicon (Si) or carbon (C).

4. The integrated circuit device of claim 1, wherein the copper-containing material layer comprises at least one of nitrogen (N) or phosphorus (P).

5. The integrated circuit device of claim 1, wherein the copper-containing material layer comprises boron (B).

6. The integrated circuit device of claim 1, wherein the interconnect line comprises copper.

7. The integrated circuit device of claim 1, wherein the polymer layer comprises polyimide or polybenzoxazole (PBO).

8. The integrated circuit device of claim 1, wherein the passivation layer has an opening exposing a portion of the semiconductor substrate, and the interconnect line is formed on a portion of the passivation layer and fills the opening of the passivation layer.

9. The integrated circuit device of claim 8, further comprising a Ti layer underlying the interconnect line and lining the bottom and sidewalls of the opening of the passivation layer.

10. The integrated circuit device of claim 9, further comprising a copper layer formed between the interconnect line and the Ti layer.

11. The integrated circuit device of claim 1, wherein the polymer layer has an opening exposing a portion of the protection layer.

12. The integrated circuit device of claim 11, further comprising a bump structure overlying the polymer layer and electrically connected to the protection layer through the opening of the polymer layer.

13. The integrated circuit device of claim 12, wherein the bump structure comprises a copper post.

14. The integrated circuit device of claim 13, wherein the bump structure comprises a cap layer on the copper post.

15. The integrated circuit device of claim 14, wherein the cap layer comprises at least one of a nickel-containing layer, a tin-containing layer or combinations thereof.

16. The integrated circuit device of claim 12, wherein the bump structure comprises a tin-containing layer on sidewalls of a copper post.

17. An integrated circuit device, comprising:
a semiconductor substrate comprising a contact region;
a passivation layer overlying the semiconductor substrate and having an opening exposing a portion of the contact region;
a copper line overlying a portion of the passivation layer and filling the opening, electrically connected to the contact region; and
a protection layer formed on a surface of the copper line and contacting sidewalls of the copper line, wherein the protection layer is a copper-containing material layer comprising at least one of a group III element, a group IV element, or a group V element.

18. The integrated circuit device of claim 17, wherein the protection layer is at least one of a CuGeN layer, a CuGe layer, a CuSi layer, a CuSiN layer, a CuSiGeN layer, a CuN layer, a CuP layer, a CuC layer, a CuB layer, and any combination thereof.

19. The integrated circuit device of claim 17, further comprising a Cu post on the protection layer.

20. An integrated circuit device, comprising:
a semiconductor substrate;
a passivation layer overlying the semiconductor substrate;
a polymer layer overlying the passivation layer, a portion of the polymer layer in direct contact with a portion of the passivation layer;
an interconnect line formed between the passivation layer and the polymer layer; and
a protection layer formed between the interconnect line and the polymer layer;
wherein the protection layer is a copper-containing material layer comprising at least one of a group III element, a group IV element and a group V element.

* * * * *